United States Patent
Kim

(10) Patent No.: US 8,816,219 B2
(45) Date of Patent: Aug. 26, 2014

(54) METAL STRIP ASSEMBLY FOR EMI SHIELD CASE, EMI SHIELD CASE INCLUDING THE SAME, AND FABRICATION METHOD OF THE CASE

(75) Inventor: Sun-Ki Kim, Kyeonggi-do (KR)

(73) Assignees: Joinset Co. Ltd. (KR); Sun-Ki Kim (KR)

( * ) Notice: Subject to any disclaimer, the term of this patent is extended or adjusted under 35 U.S.C. 154(b) by 67 days.

(21) Appl. No.: 13/473,098

(22) Filed: May 16, 2012

(65) Prior Publication Data
US 2013/0008707 A1    Jan. 10, 2013

(30) Foreign Application Priority Data
Jul. 4, 2011  (KR) .................. 10-2011-0065993

(51) Int. Cl.
*H05K 9/00*  (2006.01)

(52) U.S. Cl.
USPC ............ 174/354; 174/384; 174/382; 361/818

(58) Field of Classification Search
USPC ......................... 174/354, 382, 384; 361/818
See application file for complete search history.

(56) References Cited

U.S. PATENT DOCUMENTS

| | | | | |
|---|---|---|---|---|
| 4,890,199 A | * | 12/1989 | Beutler | 361/818 |
| 5,577,268 A | * | 11/1996 | Ho et al. | 455/90.3 |
| 6,501,016 B1 | * | 12/2002 | Sosnowski | 174/382 |
| 7,626,127 B2 | * | 12/2009 | Kakinoki | 174/382 |
| 7,876,579 B1 | * | 1/2011 | Tsau | 361/818 |
| 2002/0166683 A1 | | 11/2002 | Shlahtichman et al. | |
| 2011/0188226 A1 | | 8/2011 | Kim | |

FOREIGN PATENT DOCUMENTS

| | | |
|---|---|---|
| JP | 2006-310881 | 11/1994 |
| JP | 2006-114646 | 4/2006 |
| KR | 06-310881 | 11/1994 |
| KR | 2006-114646 | 4/2006 |
| KR | 1020100115069 | 10/2010 |
| WO | WO 2009/025405 | * 2/2009 |

* cited by examiner

*Primary Examiner* — Hung Ngo
(74) *Attorney, Agent, or Firm* — Locke Lord LLP; Alan B. Clement; Peter J. Fallon

(57) ABSTRACT

Provided is a metal strip for an electromagnetic interference shield case. The metal strip is uniform in width and thickness. A metal clip that is integrated with at least one pair of face-to-face elastic parts and is appropriate for soldering is fitted on an end of the metal strip along a width direction of the metal strip. The metal strip is bent and cut so as to have a shape corresponding to a ground pattern disposed on a printed circuit board, and then, a bottom surface of the metal clip is soldered to the ground pattern or a solder member disposed on the ground pattern.

12 Claims, 3 Drawing Sheets

METAL STRIP ASSEMBLY FOR EMI SHIELD CASE, EMI SHIELD CASE INCLUDING THE SAME, AND FABRICATION METHOD OF THE CASE

FIELD OF THE INVENTION

The present invention relates to a metal strip assembly for an electromagnetic interference (EMI) shield case, and more particularly, to a metal strip assembly that makes it possible for a designer to economically and quickly fabricate an EMI shield case for verifying his/her design, without using an extra tool.

In addition, the present invention relates to an EMI shield case including the metal strip assembly, and a fabrication method of the EMI shield case.

BACKGROUND OF THE INVENTION

Along with the trend of high frequency, miniaturization, and high integration, heat, static electricity, and electromagnetic waves significantly affect electronic devices and information/communication devices. For example, as performances of high frequency electronic devices, e.g., the processing speed of microprocessors and the storage capacity of memories are increased, and the size thereof is decreased, they emit a larger amount of heat and electromagnetic waves. In addition, such high frequency electronic devices or modules are susceptible to heat, static electricity, and electromagnetic waves around them.

Thus, in order to prevent electromagnetic waves from being emitted out of a high frequency electronic device or module, or to shield a high frequency electronic device or module from external electromagnetic waves, the high frequency electronic device or module is covered with an electromagnetic interference (EMI) shield case, and then, the EMI shield case is electrically and mechanically connected to a ground pattern of a printed circuit board.

In this case, the EMI shield case includes an electrical conductive member such as a metal sheet to block electromagnetic waves, and has a box shape with at least one opening to cover an electronic device or module mounted on the printed circuit board.

The EMI shield case has a certain strength to protect an inner electronic device or module from external force or shock. Particularly, small and portable high frequency devices such as mobile phones include a slim and high strength EMI shield case.

For example, an EMI shield case may be adapted for a reflow soldering process through vacuum pickup.

In general, an EMI shield case including a metal sheet is used to protect a high frequency electronic device or module mounted on a printed circuit board from electromagnetic waves. To fabricate such an EMI shield case, a high strength metal sheet formed of stainless steel, for example, SUS 301 with a thickness of about 0.15 mm may be pressed using a press mold. Then, the EMI shield case may be tinned to be directly soldered to a ground pattern, or be fitted in a plurality of metal clips soldered in advance to a ground pattern.

As such, a typical EMI shield case is fabricated by pressing a metal sheet with a press mold. To produce EMI shield cases in small quantities, a metal sheet may be etched and bent using a low-priced mold.

However, such EMI shield cases and fabrication methods thereof are appropriate for mass production. That is, typical EMI shield cases and fabrication methods thereof are inappropriate to fabricate a pilot model or a prototype model. Particularly, the position of a circuit, a ground pattern, and an electronic device on a printed circuit board may be variously designed and be occasionally changed for satisfying appropriate electric and mechanical characteristics, and various design changes for dissipating heat may be made. Thus, when EMI shield cases appropriate to variously and occasionally designed circuits and ground patterns are fabricated using the above described methods, the following limitations may be encountered.

1) When EMI shield cases corresponding to changeable circuits and ground patterns are fabricated in small quantities, a press process using a press mold, or an etching and bending process takes a long time and high cost. As a result, it may be difficult to effectively correspond to quick and various design processes for a circuit and a ground pattern.

2) It takes a long time and high cost to modify a press mold or a bending mold.

3) It takes a long time and high cost to optimize an EMI shield case to suit a certain purpose.

4) A mold design for fabricating an EMI shield case requires specialized skills.

5) It is difficult to reliably solder a small metal clip to a ground pattern of a printed circuit board.

SUMMARY OF THE INVENTION

An object of the present invention is to provide a metal strip assembly that makes it possible for a designer to quickly fabricate an EMI shield case without using an extra tool.

Another object of the present invention is to provide a metal strip assembly that makes it possible to economically fabricate an EMI shield case in various shapes.

Another object of the present invention is to provide a metal strip assembly that makes it possible to easily modify an EMI shield case according to a change of a ground pattern.

Another object of the present invention is to provide an EMI shield case that makes it possible to efficiently control a heat emission amount.

Another object of the present invention is to provide an EMI shield case optimized according to a purpose.

Another object of the present invention is to provide an EMI shield case on which a soldering process and a re-work process after the soldering process can be efficiently performed.

Another object of the present invention is to provide an EMI shield case that is appropriate for surface mounting using vacuum pickup, and reflow soldering using solder cream.

Another object of the present invention is to provide a method of fabricating the EMI shield case.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE INVENTION

According to an aspect of the present invention, there is provided a metal strip for an electromagnetic interference shield case, which is uniform in width and thickness, wherein a metal clip that is integrated with at least one pair of elastic parts and is appropriate for soldering is fitted on an end of the metal strip along a width direction of the metal strip, wherein the metal strip is bent and cut so as to have a shape corresponding to a ground pattern disposed on a printed circuit board, and then, a bottom surface of the metal clip is soldered to the ground pattern or a solder member disposed on the ground pattern.

According to another aspect of the present invention, there is provided an electromagnetic interference shield case including: a metal strip that is uniform in width and thickness, wherein a metal clip that is integrated with at least one pair of elastic parts and is appropriate for soldering is fitted on an end of the metal strip along a width direction of the metal strip; and an electrical conductive cover covering an opening defined by the other end of the metal strip along the width direction thereof, wherein the metal strip is bent and cut so as to have a shape corresponding to a ground pattern disposed on a printed circuit board, and then, a bottom surface of the metal clip is soldered to the ground pattern or a solder member disposed on the ground pattern.

According to another aspect of the present invention, there is provided a method of fabricating an electromagnetic interference shield case, including: preparing a metal strip that is uniform in width and thickness, wherein a metal clip that is integrated with at least one pair of elastic parts and is appropriate for soldering is fitted on an end of the metal strip along a width direction of the metal strip; bending and cutting the metal strip so as to have a shape corresponding to a ground pattern disposed on a printed circuit board; and installing an electrical conductive cover to cover an opening defined by the other end of the bent metal strip along the width direction thereof.

DETAILED DESCRIPTION OF THE PREFERRED EMBODIMENTS

Embodiments of the present invention will be described below in more detail with reference to the accompanying drawings.

Figure 1:
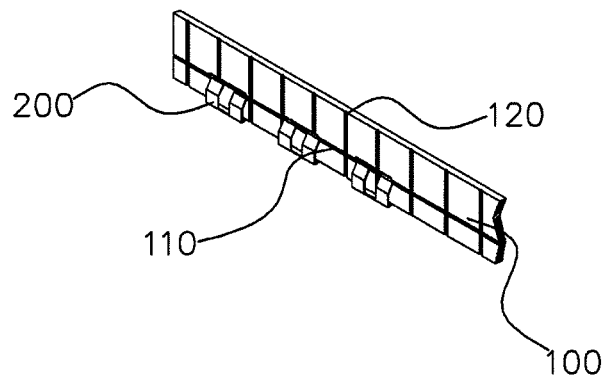
FIG. 1 is a perspective view illustrating a metal strip assembly for an electromagnetic interference (EMI) shield case, according to an embodiment of the present invention.
Figure 2:
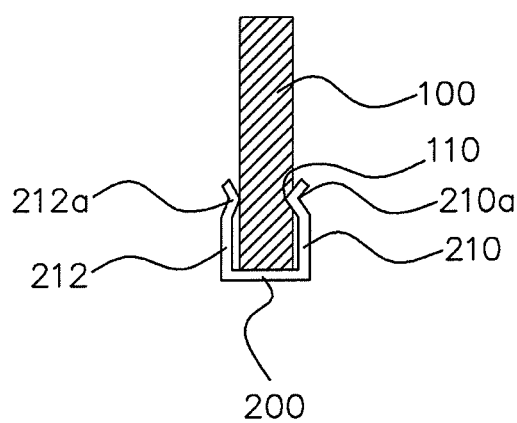
FIG. 2 is a vertical cross-sectional view illustrating the metal strip assembly of FIG. 1.
Figure 2A:
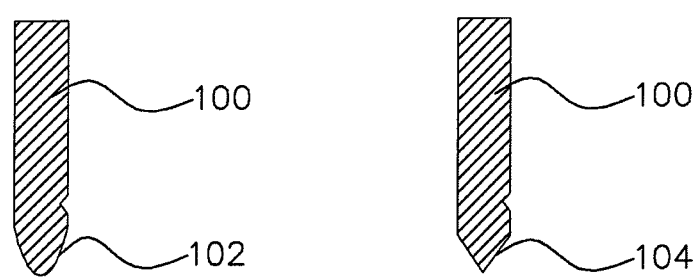
FIG. 2A is a cross-sectional view illustrating other examples of a metal strip of FIG. 1.

FIG. 1 is a perspective view illustrating a metal strip assembly for an electromagnetic interference (EMI) shield case, according to an embodiment of the present invention. FIG. 2 is a vertical cross-sectional view illustrating the metal strip assembly of FIG. 1. FIG. 2A is a cross-sectional view illustrating other examples of a metal strip of FIG. 1.

A metal strip 100 according to the current embodiment is uniform in width and thickness, and a metal clip 200 including elastic parts is fitted on an end of the metal strip 100 along the width direction of the metal strip 100. The metal strip 100 may be formed by slitting and pressing a wide metal coil roll.

Referring to FIG. 2A, an end of the metal strip 100 has a round cross section 102 or a hopper shaped cross section 104 that decreases in width, so that the metal clip 200 can be easily fitted on the metal strip 100.

For example, the metal strip 100 may have a thickness ranging from about 0.08 mm to about 0.3 mm, and a width ranging from about 0.8 mm to 20 mm. The metal strip 100 may be formed of a high strength metal sheet for providing mechanical strength and heat resistance, but is not limited thereto. Two types of materials may be used to form the metal strip 100 according to whether a soldering process is performed. When a soldering process is performed, a copper alloy such as phosphor bronze or beryllium copper may be used. When a soldering process is not performed, stainless steel or aluminum may be used.

The metal strip 100 may be formed of a metal sheet to maintain a bent state at about 90°.

The metal clip 200 is integrated with at least one pair of elastic parts 210 and 212, and is appropriate for soldering. For example, the metal clip 200 may be formed by pressing a high strength metal sheet and plating an outermost layer thereof with stannum for facilitating soldering.

The elastic parts 210 and 212 may face each other to provide sufficient elasticity even at small size.

The elastic parts 210 and 212 may be the same in dimension and shape to provide uniform elasticity, but are not limited thereto, and thus, may be varied in dimension and structure, provided that the metal strip 100 can be elastically fitted between the elastic parts 210 and 212.

The elastic parts 210 and 212 has a certain holding force to removably insert the metal strip 100 in the metal clip 200 soldered to a ground pattern of a printed circuit board.

For example, the metal clip 200 may have a length ranging from about 4 mm to about 10 mm, a width ranging from about 0.8 mm to 2 mm, and a height ranging from about 1 mm to 5 mm.

A recess 110 is disposed on side surfaces of the metal strip 100, and is continuous along the longitudinal direction of the metal strip 100. Referring to FIG. 2, one of pressing portions 210a and 212a of the elastic parts 210 and 212 is fitted in the recess 110.

Thus, the elastic parts 210 and 212 pressing the metal strip 100 are guided by the recess 110, so that the metal clip 200 can be moved along the longitudinal direction of the metal strip 100.

In addition, the metal clip 200 can be easily fitted on the side surfaces of the metal strip 100 at a certain height.

According to the above described structure, when the metal strip 100 is bent to correspond to a ground pattern of a printed circuit board, the metal clip 200 can be easily moved from a bent portion of the metal strip 100, which will be described later.

Although the recess 110 is formed in a side surface of the metal strip 100 in FIG. 2, a plurality of recesses may be formed in both side surfaces thereof. Furthermore, the recess 110 may have a V shaped or half circular cross section.

In the state where the metal clip 200 is fitted on the metal strip 100, the metal strip 100 is bent and cut to a shape corresponding to a ground pattern of a printed circuit board. Particularly, the end of the metal strip 100 fitted in the metal clip 200 is oriented to a printed circuit board, and the metal strip 100 is bent in a shape corresponding to a ground pattern of the printed circuit board. Then, when the metal strip 100 returns to the start point thereof, the metal strip 100 is cut.

To facilitate the bending of the metal strip 100, a plurality of bending recesses 120 extending along the width direction of the metal strip 100 are disposed on a side surface of the metal strip 100, and are arrayed along the longitudinal direction of the metal strip 100, so that the metal strip 100 can be bent at the bending recesses 120. Even when the metal strip 100 is bent out of the bending recesses 120, since the metal strip 100 is thin and narrow, the metal strip 100 can be easily bent to about 90°.

Both ends of the metal strip 100 may be coupled to each other so as to form a closed circuit, or the ends of the metal strip 100 may be spaced a certain distance from each other. In this state, the bottom surface of the metal clip 200 fitted on one of both the ends of the metal strip 100 may be soldered to the ground pattern or a solder member formed on the ground pattern. Thus, the solder member may be applied to the bottom surface of the metal clip 200 or to the ground pattern.

For example, a soldering process may be performed only between the metal clip 200 and the ground pattern or solder cream formed on the ground pattern.

As described above, according to the current embodiment, a designer can quickly fabricate a side wall for an EMI shield case, without using a separate device. Thus, EMI shield cases having various shapes can be inexpensively and optimally fabricated, and an EMI shield case can be quickly and easily modified according to changes of a circuit and a ground pattern.

In addition, an EMI shield case as a test sample can be quickly and inexpensively fabricated prior to mass production.

In addition, a metal clip appropriate for soldering is coupled to a shield strip, and thus, a soldering process can be reliably performed, and a re-work process can be efficiently performed after the soldering process.

Figure 3:
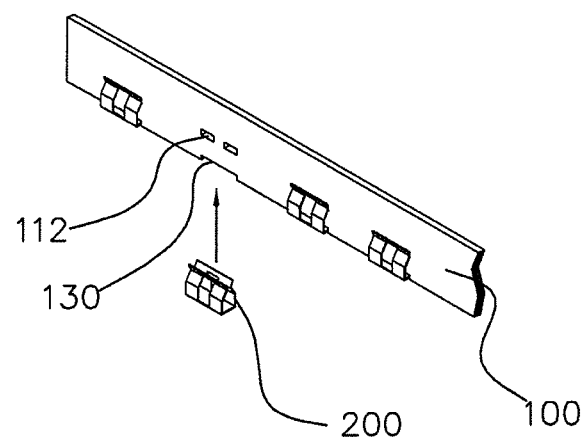
FIG. 3 is a perspective view illustrating a metal strip assembly for an EMI shield case, according to another embodiment of the present invention.
Figure 4:
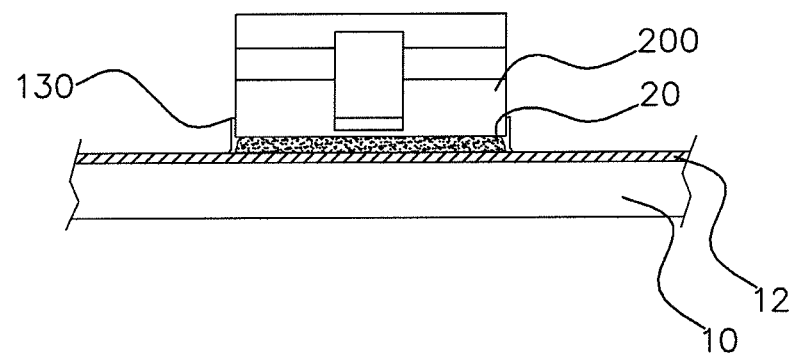
FIG. 4 is a cross-sectional view illustrating a state where the metal strip assembly of FIG. 3 is mounted on a printed circuit board.

FIG. 3 is a perspective view illustrating a metal strip assembly for an EMI shield case, according to an embodiment of the present invention. FIG. 4 is a cross-sectional view illustrating a state where the metal strip assembly of FIG. 3 is mounted on a printed circuit board.

A plurality of recesses 130 are disposed on an end of a metal strip 100 along the longitudinal direction of the metal strip 100, and metal clips 200 are fitted on the recesses 130.

Notches or through holes 112 are disposed on a side surface of the metal strip 100 above the recesses 130 to receive pressing portions 210a of elastic parts 210 and 212 of the metal clip 200.

According to the above structure, the metal clip 200 can be fitted on the metal strip 100 at the same height from the end of the metal strip 100 at all times. In addition, the bottom surface of the metal clip 200 is trapped in the recess 130, so that the metal clip 200 can be prevented from protruding out of the lower end of the metal strip 100.

As such, the bottom surface of the metal clip 200 disposed in the recesses 130 is higher than the lower end of the metal strip 100 out of the recesses 130 by the height of solder cream provided during soldering. Thus, after the soldering, the solder cream formed on the bottom surface of the metal clip 200 is approximately flush with the lower end of the metal strip 100 out of the recesses 130, thereby improving EMI shield efficiency.

Referring to FIG. 4, the bottom surface of the metal clip 200 is attached through a solder 20 to a ground pattern 12 of a printed circuit board 10. At this point, the lower end of the metal strip 100 out of the metal clip 200 may contact the ground pattern 12 to improve the EMI shield efficiency.

For example, a soldering process may be performed only between a metal clip and a ground pattern or solder cream formed on the ground pattern.

Figure 5:
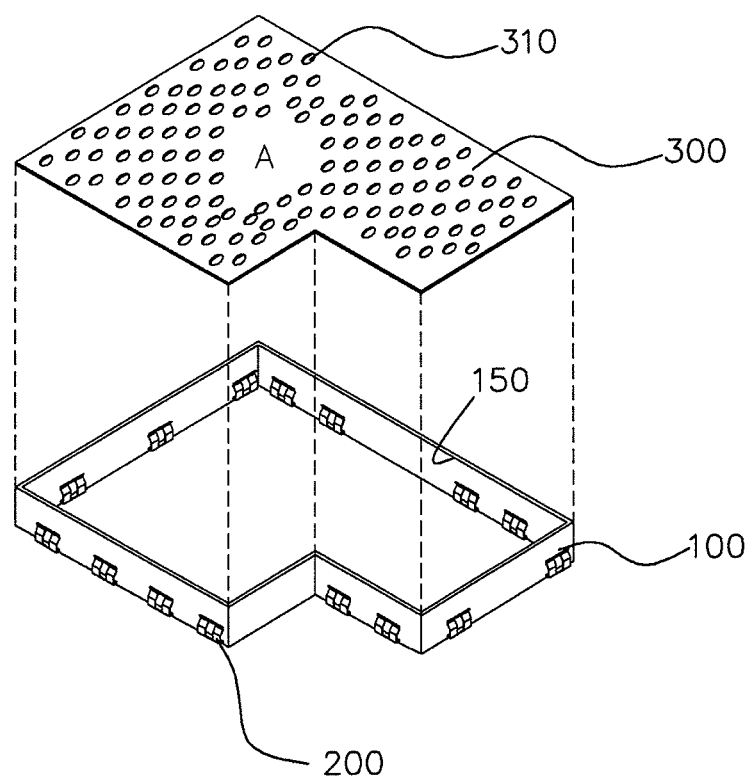
FIG. 5 is a perspective view illustrating an EMI shield case according to another embodiment of the present invention.

FIG. 5 is a perspective view illustrating an EMI shield case according to an embodiment of the present invention.

Both the ends of the metal strip 100 fitted in the metal clip 200 illustrated in FIG. 1 or 3 may be electrically and mechanically coupled to each other so as to form a closed circuit, or the ends of the metal strip 100 may be spaced a certain distance from each other. In this state, an electrical conductive cover 300 covers an opening 150 defined by the upper end of the metal strip 100 to thereby form an EMI shield case.

The electrical conductive cover 300 may be coupled to the metal strip 100 through an adhesive or mechanical coupling. For example, the bottom edge of the electrical conductive cover 300 may be coupled onto the upper end of the metal strip 100, or the edge of the electrical conductive cover 300 may be bent downward to form a side wall that is fitted in the opening 150. Alternatively, the outer surface of the opening 150 may be fitted in the side wall. The electrical conductive cover 300 may include one of a metal adhesive tape and a metal sheet, which has a thickness ranging from about 0.08 mm to about 0.2 mm.

For example, the electrical conductive cover 300 may have heat emitting holes 310 to emit heat from electronic devices therein. When the electrical conductive cover 300 includes a metal adhesive tape, the heat emitting holes 310 may be optionally and easily formed therein.

For example, an EMI shield case may be appropriate for surface mounting using vacuum pickup, and reflow soldering using solder cream. To this end, a space for vacuum pickup is formed in at least one portion of the electrical conductive cover 300, for example, in a portion A of the electrical conductive cover 300 having the heat emitting holes 310, and the bottom surface of the metal clip 200 fitted on an end of the metal strip 100 constituting a side wall is coupled through a solder to a ground pattern of a printed circuit board.

Preferably, the bottom surface of the electrical conductive cover 300 may have a certain function. For example, a rubber sheet for absorbing electromagnetic waves, or a thermal conductive rubber sheet may be attached to the bottom surface of the electrical conductive cover 300.

Hereinafter, a method of fabricating an EMI shield case by using a metal strip assembly will now be described with reference to FIG. 5 according to an embodiment of the present invention.

In a state where the metal clip 200 is fitted on an end of the metal strip 100 along the width direction thereof, a circuit designer bends and cuts the metal strip 100 to a shape corresponding to a ground pattern of a printed circuit board designed by the circuit designer, and electrically and mechanically couples both the face-to-face ends of the metal strip 100 to each other so as to form a closed loop. Alternatively, the ends of the metal strip 100 may be spaced a certain distance from each other without adhering the ends of the metal strip 100 to each other.

For example, the metal strip 100 may be bent to about 90°, and may have at least one tetragonal shape. Referring to FIG. 5, the metal strip 100 has a combination of two tetragonal shapes.

Four or more metal clips 200 are fitted on the metal strip 100, and the metal strip 100 is bent to form a plurality of sides. As a result, at least one of the metal clips 200 is fitted on each side of the metal strip 100, and a soldering process is performed on the bottom surfaces of the metal clips 200.

As such, since the metal clips 200 appropriate for soldering are fitted on the metal strip 100, it is unnecessary for a designer to fit a metal clip on a metal strip.

In addition, since the metal strip 100 is thin and narrow, and is fitted in the metal clip 200 in advance, and a simple bending and cutting process is performed to form a side wall of the EMI shield case, an expensive press mold is unnecessary, and a process of modifying a metal strip according to a design change of a ground pattern can be performed inexpensively, quickly, and easily.

As described above, the metal strip 100 can be easily bent by using the bending recesses 120, or without using an extra tool such as a bending machine.

After a bending and cutting process, the face-to-face ends of the metal strip 100 are electrically and mechanically connected to each other. For example, the face-to-face ends of the metal strip 100 may be coupled to each other through soldering or a heat resistant electrical conductive epoxy adhesive. Through such electrical conductive coupling, the metal strip 100 forms an electrical and mechanical closed loop.

In this case, an adhesive having an adhesiveness resistant to soldering heat is used.

Then, the electrical conductive cover 300, which has a thin sheet shape with a uniform thickness, and which is at least partially flat, is positioned to cover the opening 150 defined by an end of the metal strip 100, that is, the upper end thereof.

The electrical conductive cover 300 can be easily cut to a shape corresponding to the ground pattern by using a cutting device such as a scissors or a knife, which is more economical and faster than a process using a typical press mold. In addition, a process of modifying the electrical conductive cover 300 according to a design change of the ground pattern can be performed quickly and easily.

As described above, the adhesiveness of a metal adhesive tape, mechanical coupling such as fitting, or soldering may be used to electrically and mechanically couple the electrical conductive cover 300 to the metal strip 100 having the opening.

After receiving a metal adhesive tape as the electrical conductive cover 300 and the metal strip 100 fitted in the metal clips 200, the circuit designer bends and cuts the metal strip 100 to correspond to the ground pattern of the printed circuit board he/she designed, and performs a soldering process on the metal clips 200 to complete the side wall of the EMI shield case.

In this state, the electrical conductive cover 300 is cut to a size to cover the opening defined by the metal strip 100, and then, the opening is covered with the electrical conductive cover 300 to fabricate the EMI shield case the circuit designer desires.

However, the present invention is not limited thereto. Thus, for example, after the metal strip 100 fitted in the metal clips 200 is bent and cut, the opening of the metal strip 100 opposed to the metal clips 200 may be covered with a metal cover as the electrical conductive cover 300, and then, a soldering process may be performed on the metal clips 200 to fabricate the EMI shield case.

After the EMI shield case is optimized using the above described fabrication method, the EMI shield case can be produced in large quantities by using a separate press mold for mass production.

As described above, according to an embodiment of the present invention, a designer can quickly fabricate an EMI shield case without using a separate device.

In addition, an EMI shield case can be fabricated without using an expensive press mold, and be easily modified to various shapes.

In addition, a process of modifying the EMI shield according to a design change is simple and inexpensive.

In addition, an electrical conductive cover includes a thin metal sheet or metal tape, and can be easily cut to a shape corresponding to the opening of a metal strip, by using a cutting device such as a scissors or a knife, which is more economical and faster than a process using a typical press mold.

In addition, an EMI shield case as a test sample can be quickly and inexpensively fabricated prior to mass production.

In addition, a metal clip is coupled to a metal strip, and thus, a soldering process can be reliably performed, and a re-work process can be efficiently performed after the soldering process.

In addition, the EMI shield case is appropriate for surface mounting using vacuum pickup, and reflow soldering using solder cream.

While the present invention has been described in detail, it should be understood that various changes, substitutions and alterations can be made hereto without departing from the spirit and scope of the invention as defined by the appended claims.

What is claimed is:

1. A metal strip assembly for an electromagnetic interference shield case, comprising:
   a metal strip that is uniform in width and thickness having a recess being disposed on at least one side surface of the metal strip and is continuous along a longitudinal direction of the metal strip; and
   a metal clip that is fitted on an end of the metal strip along a width direction of the metal strip having a pair of elastic parts of the metal clip comprise face-to-face portions, and at least one face-to-face portion of the elastic parts is fitted in the recess, and is appropriate for soldering, wherein the metal strip is bent and cut so as to have a shape corresponding to a ground pattern disposed on a printed circuit board, and then, a bottom surface of the metal clip is soldered to the ground pattern or a solder member disposed on the ground pattern.

2. The metal strip assembly of claim 1, wherein the metal clip is movable along a longitudinal direction of the metal strip.

3. The metal strip assembly of claim 1, wherein bending recesses disposed on a side surface of the metal strip extend along the width direction of the metal strip, and are arrayed along a longitudinal direction of the metal strip, and the metal strip is bent at the bending recesses.

4. The metal strip assembly of claim 1, wherein the end of the metal strip has a round cross-section or a hopper shaped cross-section that decreases in width.

5. The metal strip assembly of claim 1, wherein recesses disposed in the end of the metal strip are arrayed along a longitudinal direction of the metal strip, and the bottom surface of the metal clip is trapped in the recess, so that the metal clip is prevented from protruding out of the end of the metal strip.

6. The metal strip assembly of claim 5, wherein when the bottom surface of the metal clip is soldered through a solder to the ground pattern, the end of the metal strip contacts the ground pattern.

7. The metal strip assembly of claim 1, wherein a pair of elastic parts of the metal clip has a certain holding force to removably insert the metal strip in the metal clip soldered to the ground pattern.

8. The metal strip assembly of claim 1, wherein the metal strip is formed of a copper alloy when a soldering process is performed and stainless steel or aluminum when a soldering process is not performed.

9. The metal strip assembly of claim 1, wherein the metal clip is formed by pressing a high strength metal sheet having a thickness ranging from about 0.08 mm to about 0.3 mm and plating an outermost layer thereof with stannum, silver, or gold.

10. The metal strip assembly of claim 1, wherein the metal strip is bent to about 90° so as to have at least one tetragonal shape.

11. The metal strip assembly of claim 1, wherein the metal clip is provided in plurality, at least four of the metal clips are fitted on the metal strip, the metal strip is bent to form a plurality of sides, and at least one of the metal clips is fitted on each of the sides of the metal strip.

12. A metal strip assembly for an electromagnetic interference shield case, comprising:
   a metal strip that is uniform in width and thickness; and
   a metal clip that is fitted on an end of the metal strip along a width direction of the metal strip, and is appropriate for soldering,
wherein bending recesses disposed on a side surface of the metal strip extend along the width direction of the metal strip, and are arrayed along a longitudinal direction of the metal strip, and the metal strip is bent at the bending recesses and cut so as to have a shape corresponding to a ground pattern disposed on a printed circuit board, and then, a bottom surface of the metal clip is soldered to the ground pattern or a solder member disposed on the ground pattern.

\* \* \* \* \*